United States Patent
Park et al.

(10) Patent No.: US 7,050,303 B2
(45) Date of Patent: May 23, 2006

(54) SEMICONDUCTOR MODULE WITH VERTICALLY MOUNTED SEMICONDUCTOR CHIP PACKAGES

(75) Inventors: Sang-Wook Park, Seongnam-si (KR); Joong-Hyun Baek, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 104 days.

(21) Appl. No.: 10/892,441

(22) Filed: Jul. 16, 2004

(65) Prior Publication Data
US 2005/0135067 A1    Jun. 23, 2005

(30) Foreign Application Priority Data
Dec. 23, 2003 (KR) ............. 10-2003-0095436

(51) Int. Cl.
*H05K 7/20* (2006.01)
(52) U.S. Cl. ............. 361/715; 361/704; 361/719; 257/706; 165/80.3; 165/185
(58) Field of Classification Search ............. 361/703, 361/704, 715, 719, 721, 788; 257/706, 712; 165/80.3, 185
See application file for complete search history.

(56) References Cited

U.S. PATENT DOCUMENTS

| 5,684,675 | A | * | 11/1997 | Taniguchi et al. | .......... 361/704 |
| 5,786,985 | A | * | 7/1998 | Taniguchi et al. | .......... 361/707 |
| 5,999,405 | A | * | 12/1999 | Zappacosta et al. | ........ 361/704 |
| 6,075,287 | A | * | 6/2000 | Ingraham et al. | .......... 257/706 |
| 6,480,014 | B1 | | 11/2002 | Li et al. | |
| 6,862,185 | B1 | * | 3/2005 | Morris | ................. 361/721 |
| 2005/0052849 | A1 | * | 3/2005 | Keating et al. | ............. 361/719 |

FOREIGN PATENT DOCUMENTS

| KR | 1999-026510 | 4/1999 |
| KR | 10-0356800 | 10/2002 |

* cited by examiner

*Primary Examiner*—Boris Chèrvinsky
(74) *Attorney, Agent, or Firm*—Harness Dickey & Pierce, P.L.C.

(57) ABSTRACT

A semiconductor module with vertically arranged semiconductor packages may include a module board with a plurality of insertion holes. A plurality of semiconductor packages may be inserted in a vertical direction into corresponding insertion holes. The module may include a heat sink composed of a base plate and a plurality of protrusions. The protrusion may extend downward from the base plate.

33 Claims, 14 Drawing Sheets

SEMICONDUCTOR MODULE WITH VERTICALLY MOUNTED SEMICONDUCTOR CHIP PACKAGES

PRIORITY STATEMENT

This U.S. non-provisional application claims priority under 35 U.S.C. §119 to Korean Patent Application No. 2003-95436 filed Dec. 23, 2003 in the Korean Intellectual Property Office, the contents of which are incorporated herein in its entirety by reference.

BACKGROUND OF THE INVENTION

1. Field of the Invention

The present invention relates generally to a semiconductor module with vertically mounted semiconductor chip packages.

2. Description of the Related Art

A conventional semiconductor module, such as a memory module, is shown in FIG. 1. As shown in FIG. 1, a conventional semiconductor module 1200 may be composed of several semiconductor chip packages 1210 that may be mounted in a horizontal fashion on one or both flat faces of a module board 1230. The module board 1230 may have circuit patterns 1232 provided on the flat faces thereof and external contact terminals 1239 provided along one edge side thereof. For electrical connections to an external system, the packages 1210 may be electrically coupled to the external contact terminals 1239 through the circuit patterns 1232.

The conventional module 1200 configured with a horizontal mounting structure may have the limitations with regard to heat dissipation and mounting density. In a horizontal mounting structure, one flat surface of the package 1210 meets the flat face of the module board 1230, and the other flat surface is exposed to air. Thus, as heat is generated from the package 1210, heat removal by convection is made through only the outer flat surface. Therefore, the above-discussed conventional module may be susceptible to heat damage as the heat per volume rises. Further, due to a horizontal mounting structure, the conventional module may reach a mounting density limit.

In an effort to solve the above problems, a vertical mounting technique for mounting the packages on a module board has been introduced. A zigzag in-line package (ZIP) type is an example of a vertical mounting technique. The ZIP type may produce a desired effect on heat dissipation and mounting density, in a case where the module board supports only a few input/output (I/O) pins. However, the ZIP type is difficult to realize in module configuration having a substantial number of I/O pins.

An approach to overcome drawbacks of the ZIP type is to use a heat sink. FIG. 2 shows, in a cross-sectional view, a conventional semiconductor module using a heat sink. Referring to FIG. 2, a module 40 may have several semiconductor chip packages 10 vertically arranged and inserted at one end into respective sockets 32 provided on a module board 34. The module 40 may include a heat sink 36 provided above the packages 10, as shown in FIG. 2.

Each package 10 may be arranged on a corresponding circuit substrate 16, such as a printed circuit board (PCB), and may have a semiconductor chip 12 attached on one flat face of the substrate 16 through an adhesive 24. Connection paths 22 may be formed on the chip-attaching face of the substrate 16 and electrically coupled to the chip 12 through wires 26. The chip 12 and the wires 26 may be embedded in an encapsulant 28 for protection from the environment. A heat spreader 30 may be attached to the other flat face of the substrate 16 and may be bent at the top of the vertically mounted package 10, as shown in FIG. 2. The heat sink 36 may be provided across the heat spreaders 30 and attached thereto by an adhesive 38.

Due to the inclusion of a circuit substrate 16, the package 10 may realize many I/O pins. In addition, the heat sink 36 and the heat spreaders 30 may improve the heat-dissipating property of the module 40. However, a contact area between the packages 10 and the heat sink 36 may be insufficient, such that the heat-dissipating property of the module 40 may still not be satisfactory. Moreover, this type of module 40 may have drawbacks due to its relatively complicated structure and process of fabrication.

SUMMARY OF THE INVENTION

Exemplary embodiments of the present invention, in general, are directed to a semiconductor module with vertically arranged semiconductor packages. An exemplary semiconductor module may include a module board with a plurality of insertion holes. A plurality of semiconductor packages may be inserted in a vertical direction into corresponding insertion holes. The module may include a heat sink composed of a base plate and a plurality of protrusions. The protrusion may extend downward from the base plate.

BRIEF DESCRIPTION OF THE DRAWINGS

The present invention will become more apparent by describing, in detail, exemplary embodiments thereof with reference to the attached drawing, wherein like elements are represented by like reference numerals, which are given by way of illustration only and thus do not limit the exemplary embodiments of the present invention.

DETAILED DESCRIPTION OF THE EXEMPLARY EMBODIMENTS

Figure 1:
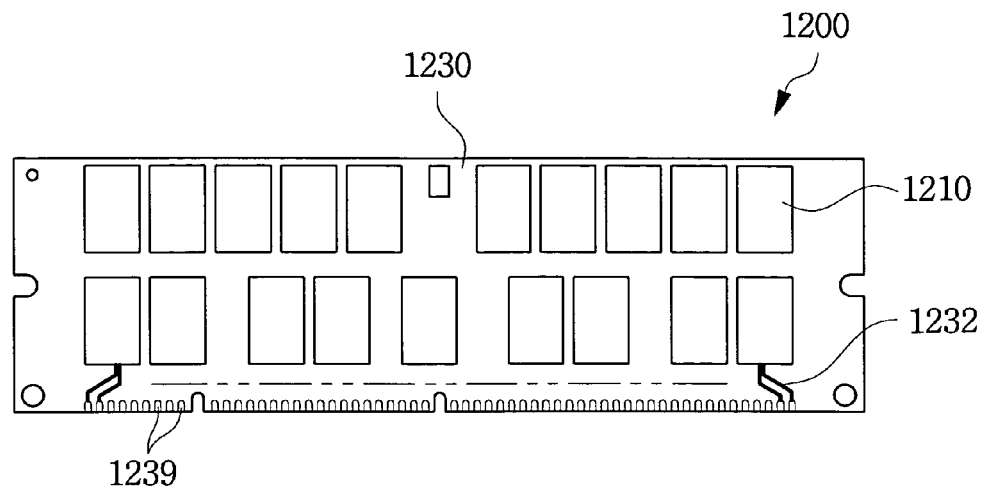
FIG. 1 is a plan view of a conventional semiconductor module.
Figure 2:
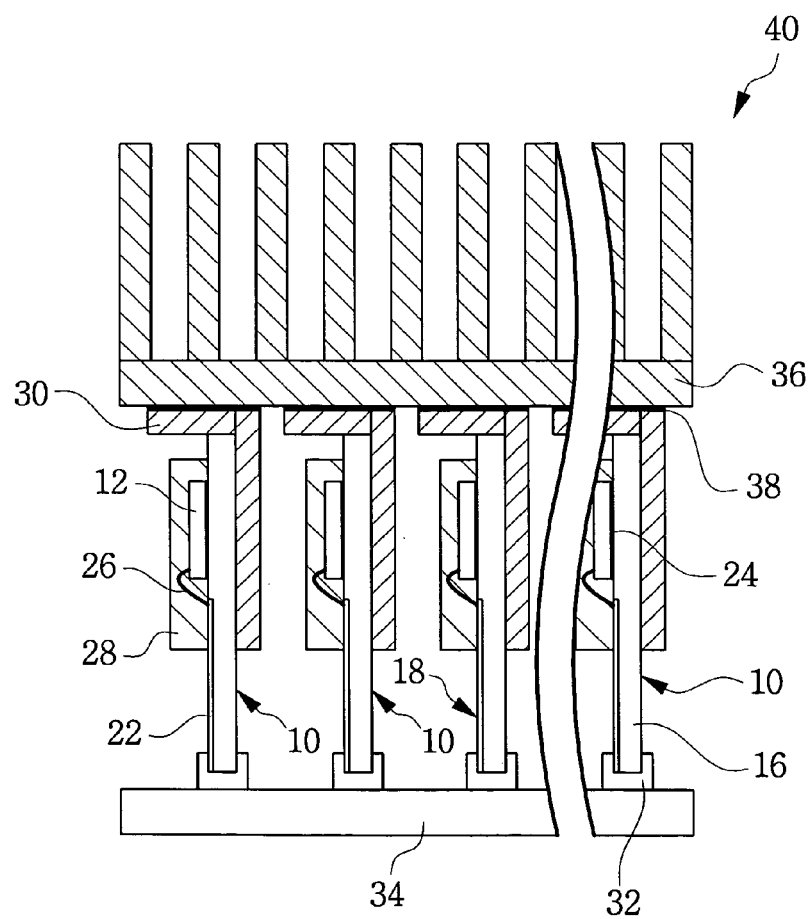
FIG. 2 is a cross-sectional view of a conventional semiconductor module.

The present invention will be described more fully with reference to the accompanying drawings, in which exemplary embodiments of the invention are shown. It should be understood, however, that exemplary embodiments of the present invention described herein can be modified in form and detail without departing from the spirit and scope of the invention. Accordingly, the exemplary embodiments described herein are provided by way of example and not of limitation, and the scope of the present invention is not restricted to the particular embodiments described herein In the description, well-known structures and processes have not been described or illustrated in detail in an effort to avoid obscuring the exemplary embodiments of the present invention. It will be appreciated that the figures may not be not drawn to scale. Rather, for simplicity and clarity of illustration, the dimensions of some elements may be exaggerated relative to other elements. Like reference numerals and characters may be used for like and corresponding parts of the various drawings.

Figure 3:
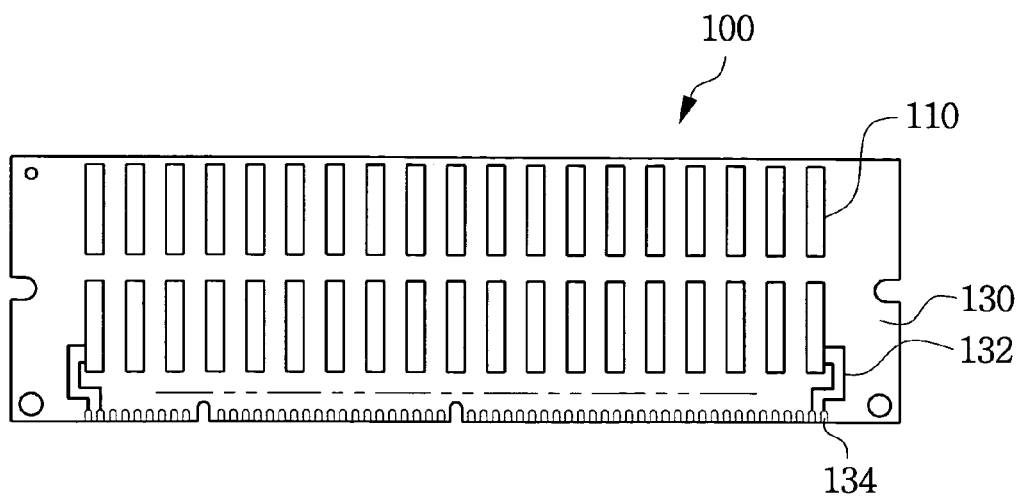
FIG. 3 is a plan view of a semiconductor module in accordance with an exemplary embodiment of the present invention.
Figure 4:
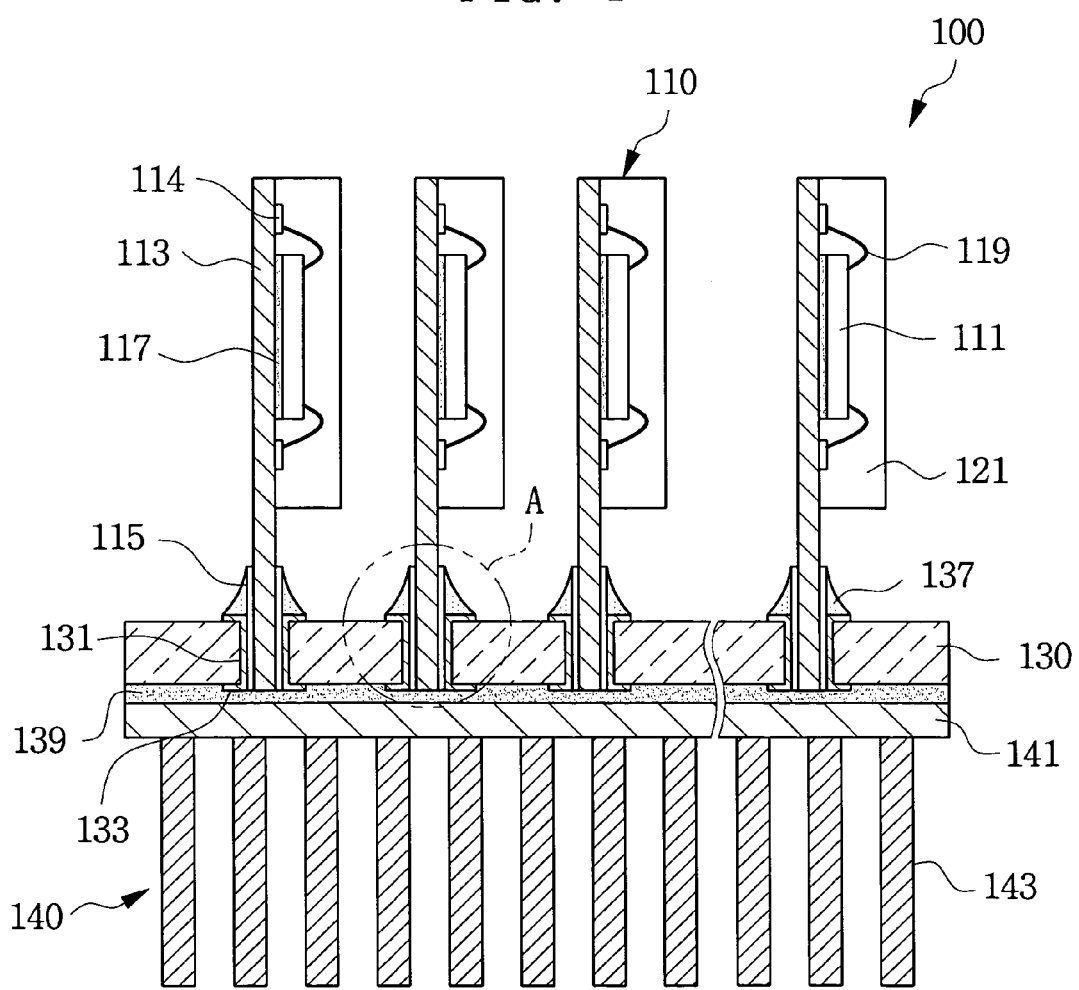
FIG. 4 is a cross-sectional view of the semiconductor module of FIG. 3.
Figure 5:
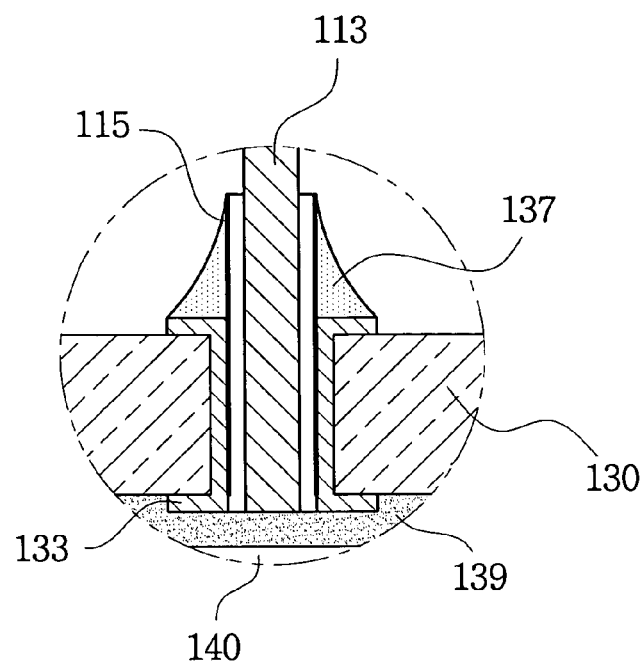
FIG. 5 is an enlarged view of a section "A" in FIG. 4.
Figure 6:
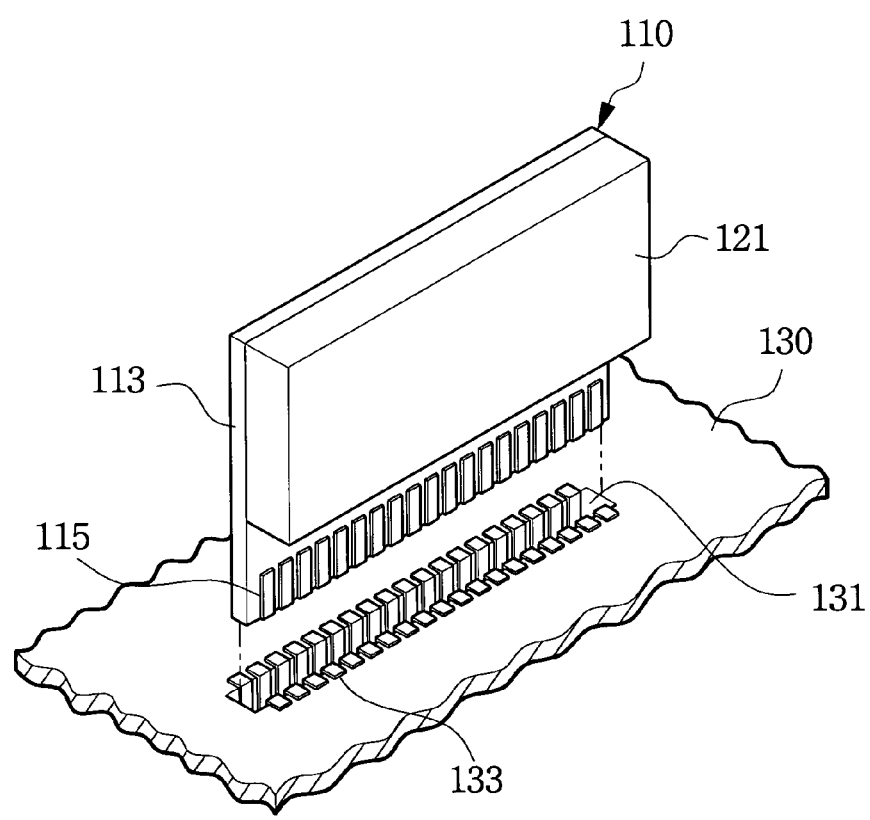
FIG. 6 is a perspective view partially illustrating the semiconductor module shown in FIG. 3.

FIG. 3 shows, in a plan view, a semiconductor module in accordance with another exemplary embodiment of the present invention. FIG. 4 is a cross-sectional view of the semiconductor module of FIG. 3, and FIG. 5 is an enlarged view of a section "A" in FIG. 4. FIG. 6 is a perspective view partially illustrating the semiconductor module of FIG. 3.

Referring to FIGS. 3 to 6, the module 100, such as a memory module, may include a plurality of semiconductor chip packages 110 that may be mounted by insertion in a vertical direction to a module board 130. The module board 130 may include circuit patterns 132 provided on a flat face thereof and external contact terminals 134 provided along one edge side thereof. For electrical connections to an external system, the respective packages 110 may be electrically coupled to the external contact terminals 134 through the circuit patterns 132.

A given package 110 may be arranged on a circuit substrate 113, such as a printed circuit board (PCB), with a semiconductor chip 111 attached on one flat face of the substrate 113 through an adhesive 117. Substrate pads 114 may be formed on the chip-attaching face of the substrate 113 and electrically coupled to the chip 111 through wires 119 made of gold, for example, although wires 119 may be composed of other materials having electrical properties similar to gold, as is evident to one of ordinary skill in the art.

Substrate connection paths 115 may be formed on both faces of one edge of the substrate 113 and electrically coupled to the respective substrate pads 114. Electrical connections between the substrate connection paths 115 and the substrate pads 114 may be made via adequate surface and/or internal paths, as is known in this art. The chip 111 and the wires 119 may be embedded in an encapsulant 121, such as epoxy resin, for protection from the environment. The encapsulant 121 may be formed so as not to cover the substrate connection paths 115, for example.

The module board 130 may include a plurality of insertion holes 131, each of which may be spaced apart from each other and which may communicate with the top and bottom of the module board 130. As best shown in FIG. 6, a given insertion hole 131 may have a generally longitudinal shape that may substantially corresponds to the width of the package 110 at the bottom of the package 110. Board connection paths 133 may be provided on sidewalls of insertion hole 131, and may be laterally spaced apart from each other. A given board connection path 133 may extend in a vertical direction and may be somewhat extended along and/or around the sides and the top and bottom faces of the module board 130 as shown in FIG. 5, for example. The board connection paths 133 may correspond to the respective substrate connection paths 115, for example.

A given package 110 may be inserted at one end into the corresponding insertion hole 131, so the substrate connection paths 115 may be in substantially close relation to the board connection paths 133 so as to touch and/or contact the board connection paths 133. Due to the insertion, the packages 110 may be mechanically mounted and electrically coupled to the module board 130. For added reliability and a more stable joint, a solder 137 may be added to join the substrate connection paths 115 and the board connection paths 133.

A heat sink 140 may be attached to the bottom face of the module board 130 through an adhesive 139 having substantially good thermal conductivity. The heat sink 140 may be composed of a base plate 141 adjoining the module board 130 and several protrusions 143 extending downward from the base plate 141 as shown in FIG. 4, for example. If the bottom ends of the packages 110 protrude downward slightly from the insertion holes 131, the heat sink 140 may include grooves (not shown for purposes of clarity) at a top surface of the base plate 141, for receiving bottom ends of the packages 110.

By using circuit substrate 113, the package 110 may realize many I/O pins. In addition, since the package 110 is almost entirely surrounded by air, heat removal by convection may be made through nearly all surfaces of the package 110. Further, since the heat sink 140 may remove heat through the entire bottom face of the module board 130. Accordingly, the heat-dissipating properties of the module 100 may be enhanced. Moreover, the vertical mounting configuration of the packages 110 may raise the mounting density of the packages 110 on the module board 130.

Another exemplary embodiment is directed to a method of forming a semiconductor module with vertically arranged semiconductor packages. For example, and referring to FIGS. 3–6 in general, to form a semiconductor module such as module 100, a module board 130 may be formed of conventionally known materials used for printed circuit boards and the like by conventionally known forming process, omitted here for reasons of brevity. A plurality of insertion holes 131 may be formed in the module board 130, and a plurality of semiconductor packages 110 (which may have been fabricated as part of the same process or by a separate process) may be inserted at first ends thereof in a vertical direction into corresponding insertion holes 131.

A heat sink 140 may be attached, via a suitable adhesive 139 (i.e., an epoxy resin), for example, to the module board 130. The heat sink 140 may be composed of the base plate 141 and the plurality of protrusions 143 which extend downward from the base plate 141 away from to the module board 130, as discussed previously and as shown in FIG. 4, for example. The base plate 141 and protrusions 143 may be formed of suitable materials by conventionally used forming processes, either as a singular structure or attached together with suitable affixing materials such as solder. The materials of base plate 141 and protrusions 143 may be materials which have heat removal properties, such as metals conventionally used in the art for heat sinks, for example.

The formed module board 130 may include a first face and a second face. A plurality of board connection paths 133 may be formed in the insertion holes. The board connection paths 133 may be composed of materials having electrically conductive properties, for example, such as gold and/or other metals as is evident to one having ordinary skill in the art. The insertion holes 131 may be formed in the module board 130 so as to be in spaced relation with one another and in contact with the first face and second face. Additionally, the packages 110 may be inserted in the insertion holes 131 so that the packages 110 are mechanically mounted on the first face of the module board 130 and electrically coupled to the board connection paths 133.

To attach heat sink 140, the base plate may be affixed to the second face of module board 130 by the adhesive 139, and the protrusions 143 may be affixed to the base plate 141 so that the protrusions 143 extend in a direction that is opposite a direction in which the vertically arranged packages 110 extend from the insertion holes 131 of the module board 130.

Figure 7:
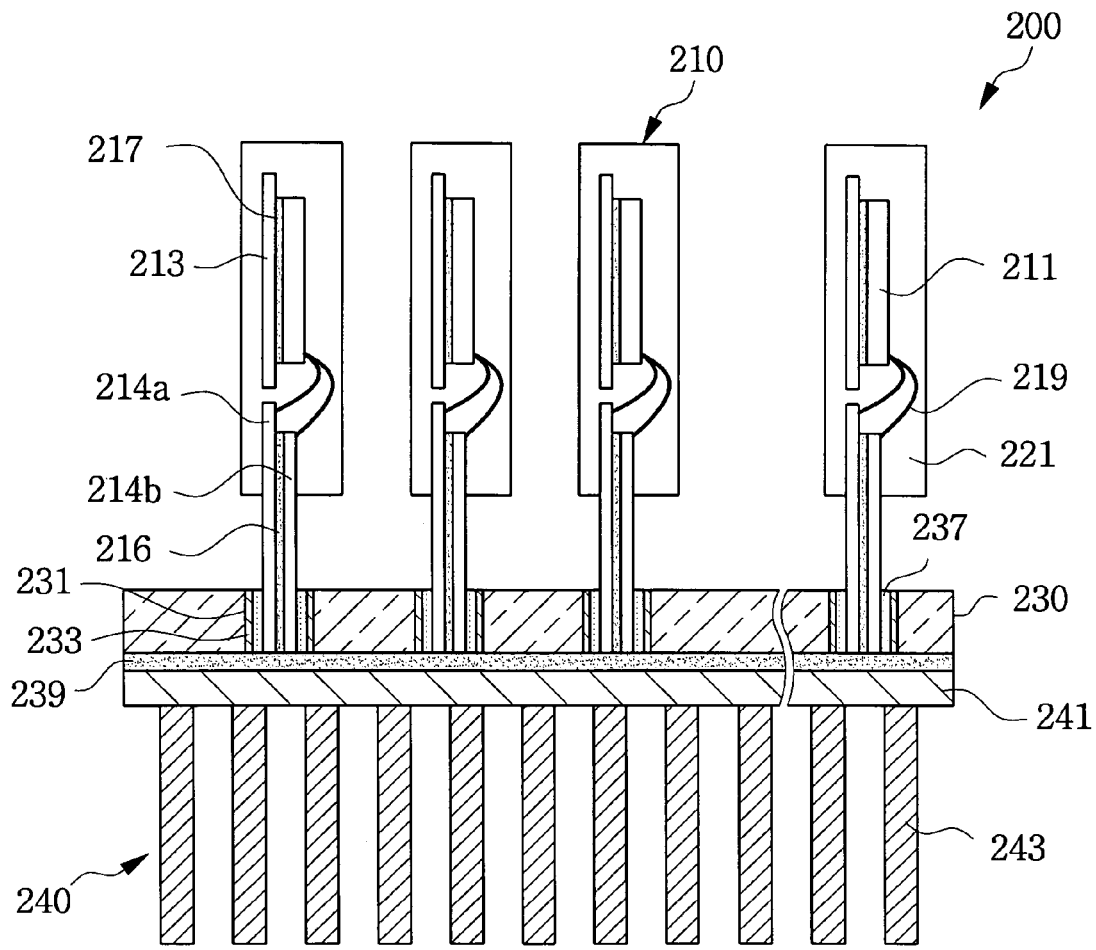
FIG. 7 is a cross-sectional view of a semiconductor module in accordance with another exemplary embodiment of the present invention.

FIG. 7 shows, in a cross-sectional view, a semiconductor module in accordance with another exemplary embodiment of the present invention. Further, FIG. 8 partially shows, in a perspective view, the semiconductor module of FIG. 7.

Figure 8:
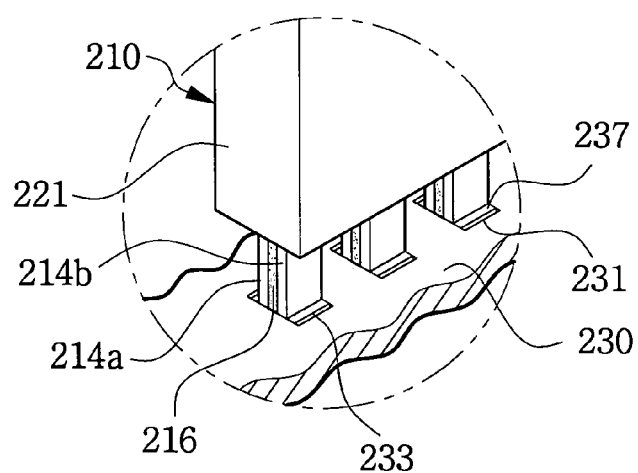
FIG. 8 is a perspective view partially illustrating the semiconductor module of FIG. 7.

Referring to FIGS. 7 and 8, a module 200 may include a plurality of semiconductor chip packages 210 that may be mounted by insertion in a vertical direction to a module board 230. With the exception of insertion holes 231, module board 230 may be the same as described in FIGS. 3–6. In addition, a heat sink 240 composed of a base plate 241 and several protrusions 243 may be the same as described in FIGS. 3–6.

In FIG. 7, a given package 210 may be arranged on a lead frame instead of on a circuit substrate. The lead frame may be composed of a die pad 213 and a plurality of lead pairs 214a and 214b attached by an insulating adhesive 216. The die pad 213 may support a semiconductor chip 211 via an adhesive 217. The lead pairs 214a and 214b, forming two layers, may be disposed near one side of the die pad 213 and electrically coupled to the chip 211 through wires 219. The chip 211, wires 219, and one end of each of the lead pairs 214a and 214b may be embedded in an encapsulant 221. The other ends of the lead pairs 214a and 214b may be inserted into the insertion hole 231 of the module board 230.

The insertion holes 231 may communicate with the top and bottom of the module board 230. Unlike FIGS. 3–6, the insertion holes 231 may be configured as a plurality of groups of insertion holes 231. That is, as shown in FIG. 8, a given group of the insertion holes 231 may be allotted to a given package 210. A pair of board connection paths 233 may be provided on both sidewalls of a given insertion hole 231, which may be electrically isolated from each other.

When the package 210 is inserted into the group of insertion holes 231 through the lead pairs 214a and 214b, the lead pairs may be arranged in substantially close proximity so as to contact or touch the respective board connection paths 233. For improved reliability and a more stable joint, a solder 237 may be added between the lead 214a and/or 214b and the board connection path 233.

Figure 9:
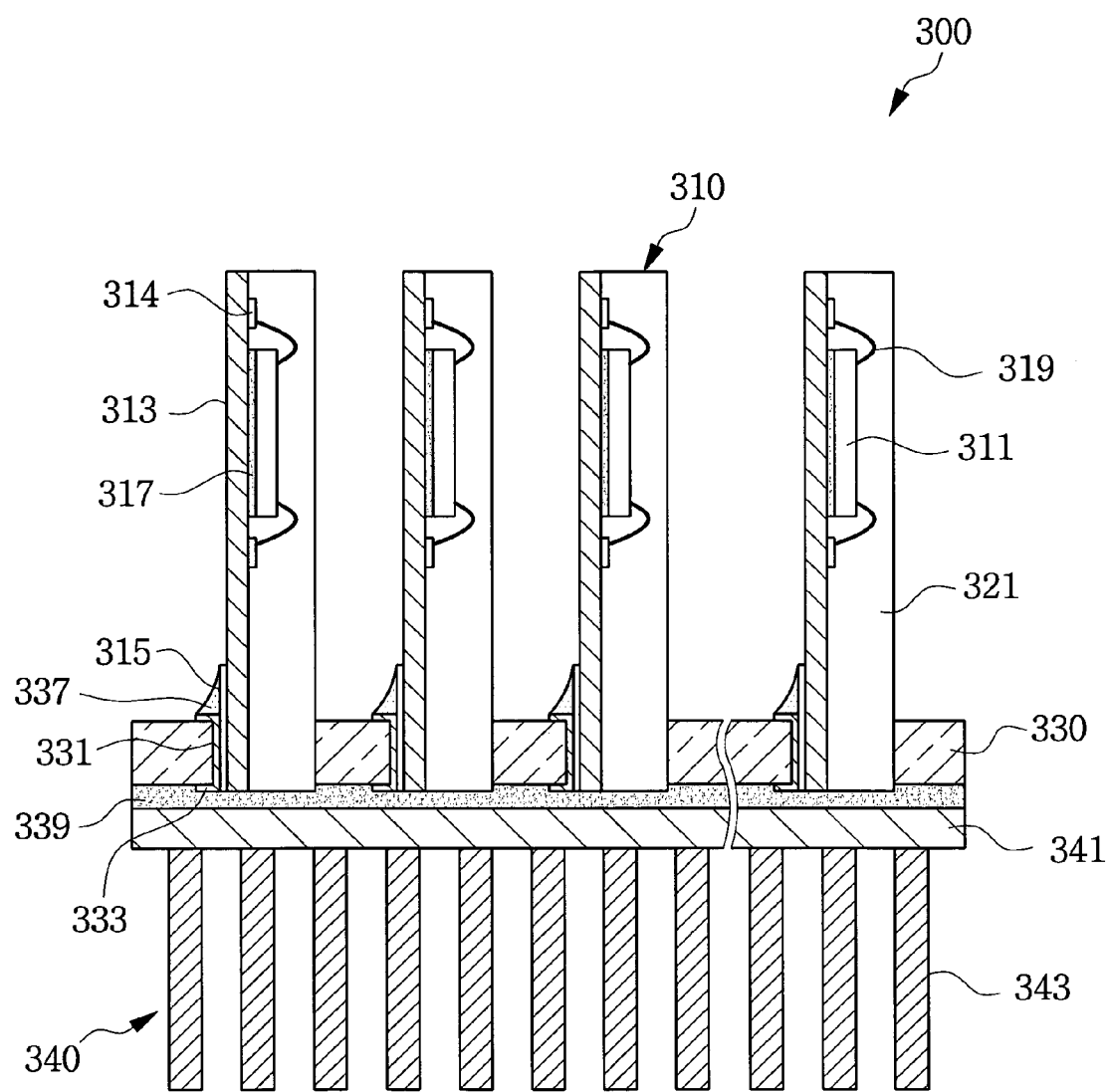
FIG. 9 is a cross-sectional view of a semiconductor module in accordance with another exemplary embodiment of the present invention.

FIG. 9 shows, in a cross-sectional view, a semiconductor module in accordance with another exemplary embodiment of the present invention. Referring to FIG. 9, a module 300 may include a plurality of semiconductor chip packages 310 that may be mounted by insertion in a vertical direction to a module board 330. With the exception of insertion holes 331, the module board 330 may be the same as described in FIGS. 3–8. In addition, a heat sink 340 composed of a base plate 341 and several protrusions 343 may be the same as described in FIGS. 3–8.

A given package 310 may include a circuit substrate 313. A semiconductor chip 311 may be attached on one flat face of the substrate 313 by an adhesive 317 and may be electrically coupled to substrate pads 314 on the substrate 313 through wires 319. The chip 311 and the wires 319 may be embedded in an encapsulant 321 that is provided on or along the chip-attaching face of the substrate 313. Substrate connection paths 315 may be formed on an opposite face of the substrate 313 and electrically coupled to the respective substrate pads 314.

The module board 330 may include a plurality of insertion holes 331 spaced apart from each other. A given insertion hole 331 may communicate with the top and bottom of the module board 330, and may have a longitudinal shape that substantially corresponds to the width of the package 310 at the bottom of package 310 to be inserted therein. Board connection paths 333 may be provided on one sidewall of a given insertion hole 331, laterally spaced apart from each other. A given board connection path 333 may extend in a vertical direction and may be partially extended along and/or across top and bottom faces of the module board 330, as shown in FIG. 9, for example. The board connection paths 333 may correspond to the substrate connection paths 315.

A given package 310 may be inserted at one end into a corresponding insertion hole 331. The board connection paths 333 on one sidewall of the insertion hole 331 may be in substantially close rotation so as to touch the substrate connection paths 315, and the sidewalls and bottom of the insertion hole 331 may contact the encapsulant 321. Upon insertion, the packages 310 may be mechanically mounted and electrically coupled to the module board 330. For improved reliability and a more stable joint, a solder 337 may be applied to join the substrate connection path 315 with the board connection path 333, for example.

Figure 10:
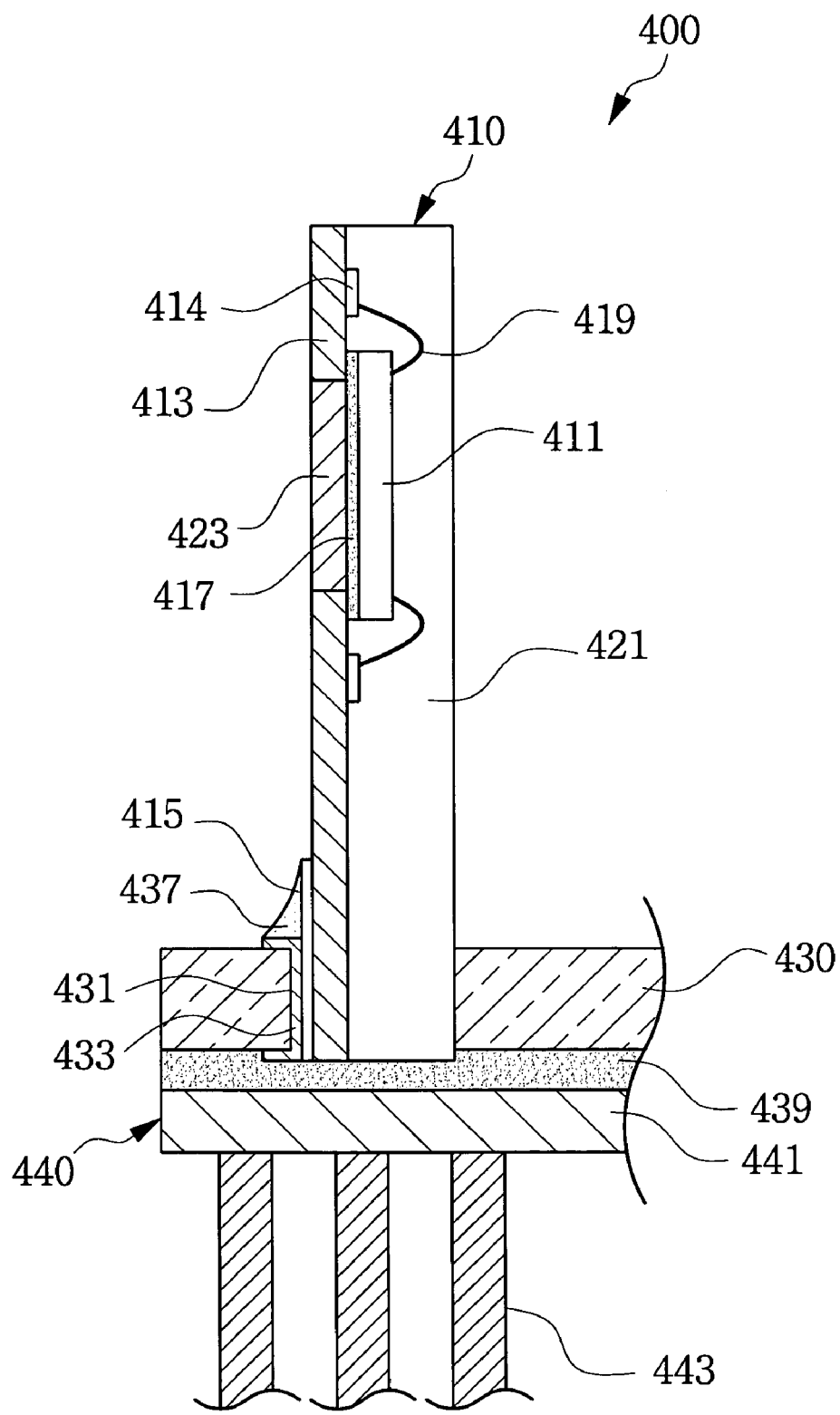
FIG. 10 is a cross-sectional view partially showing a semiconductor module in accordance with another exemplary embodiment of the present invention.

FIG. 10 partially shows, in a cross-sectional view, a semiconductor module in accordance with another exemplary embodiment of the present invention. Referring to FIG. 10, a module 400 may include a plurality of semiconductor chip packages 410 that are mounted by insertion in a vertical direction to a module board 430. The module board 430, having insertion holes 431 and board connection paths 433, may be the same as described in FIG. 9. In addition, a heat sink 440 composed of a base plate 441 and several protrusions 443 may be the same as described in FIGS. 3–9.

A given package 410 may be arranged on a circuit substrate 413. The circuit substrate may include heat slug 423 therein. A semiconductor chip 411 may be attached on one flat face of the substrate 413 by an adhesive 417 and electrically coupled to substrate pads 414 on the substrate 413 via wires 419. The heat slug 423 may be positioned underneath the chip 411 in an effort to promote a substantially rapid and effective heat removal from the chip 411. The chip 411 and the wires 419 may be embedded in an encapsulant 421 provided on and/or across the entire chip-attaching face of the substrate 413. Substrate connection paths 415 may be formed on an opposite face of the substrate 413 and electrically coupled to substrate pads 414.

A given package 410 may be inserted at one end into a corresponding insertion hole 431, and the substrate connection paths 415 may be in substantially close relation so as to touch the board connection paths 433. Thus, the packages 410 may be mechanically mounted and electrically coupled to the module board 430. For improved reliability, a solder 437 may be applied between the substrate connection paths 415 and the board connection paths 433.

Figure 11:
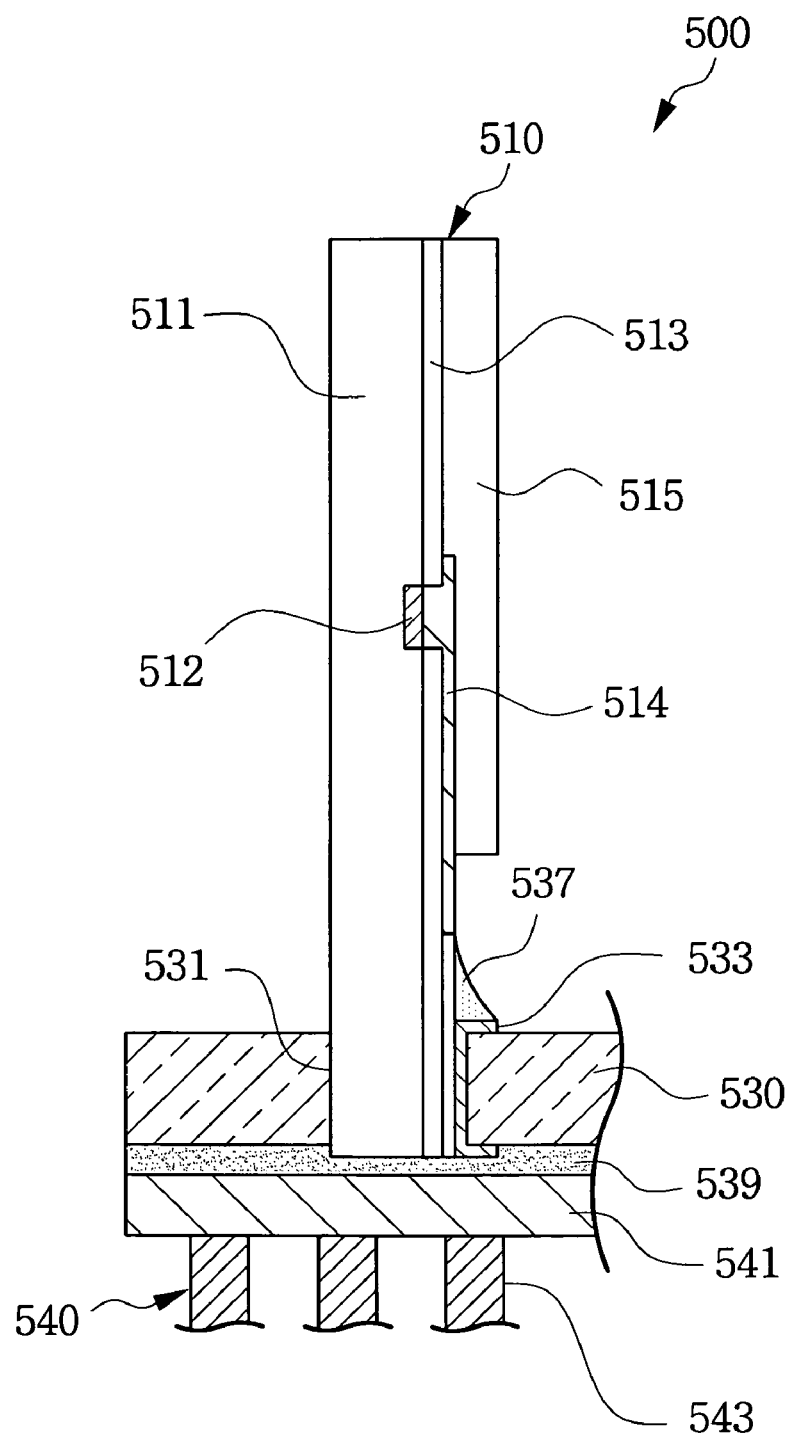
FIG. 11 is a cross-sectional view partially showing a semiconductor module in accordance with another exemplary embodiment of the present invention.

FIG. 11 partially shows, in a cross-sectional view, a semiconductor module in accordance with another exemplary embodiment of the present invention. Referring to FIG. 11, a module 500 may include a plurality of semiconductor chip packages 510 that may be mounted by insertion in a vertical direction to a module board 530. The module board 530, having insertion holes 531 and board connection paths 533, is substantially the same as described in FIG. 10. In addition, a heat sink 540, having a base plate 541 and several protrusions 543, may be the same as described in FIGS. 3–10.

Unlike the foregoing exemplary embodiments FIGS. 3–10, a given package 510 employs neither a circuit substrate nor a lead frame. In FIG. 11, a semiconductor chip 511 may be embodied as the package 510 by using what may be referred to as 'rerouting technique'. The chip 511 may include a plurality of chip pads 512 provided on an active surface of the chip 511. A passivation layer 513 may cover the active surface of the chip 511, but the chip pads 512 may be exposed through the passivation layer 513. Rerouting paths 514 may be provided on the passivation layer 513 for electrical connections to the module board 530. A given rerouting path 514 may be electrically coupled at one end to the chip pad 512 and may extend at the other end to one edge of the chip 511. An encapsulant 515 may cover the rerouting paths 514, except the extended ends.

A given package 510, that is, the rerouted chip 511, may be inserted at one end into the corresponding insertion hole 531. Upon insertion, the rerouting paths 514 may be in substantially close relation to board connection paths 533 so as to touch the respective board connection paths 533. Thus, the packages 510 may be mechanically mounted and electrically coupled to the module board 530. A solder 537 may be used between the rerouting paths 514 and the board connection paths 533 so as to enhance reliability, for example.

Figure 12:
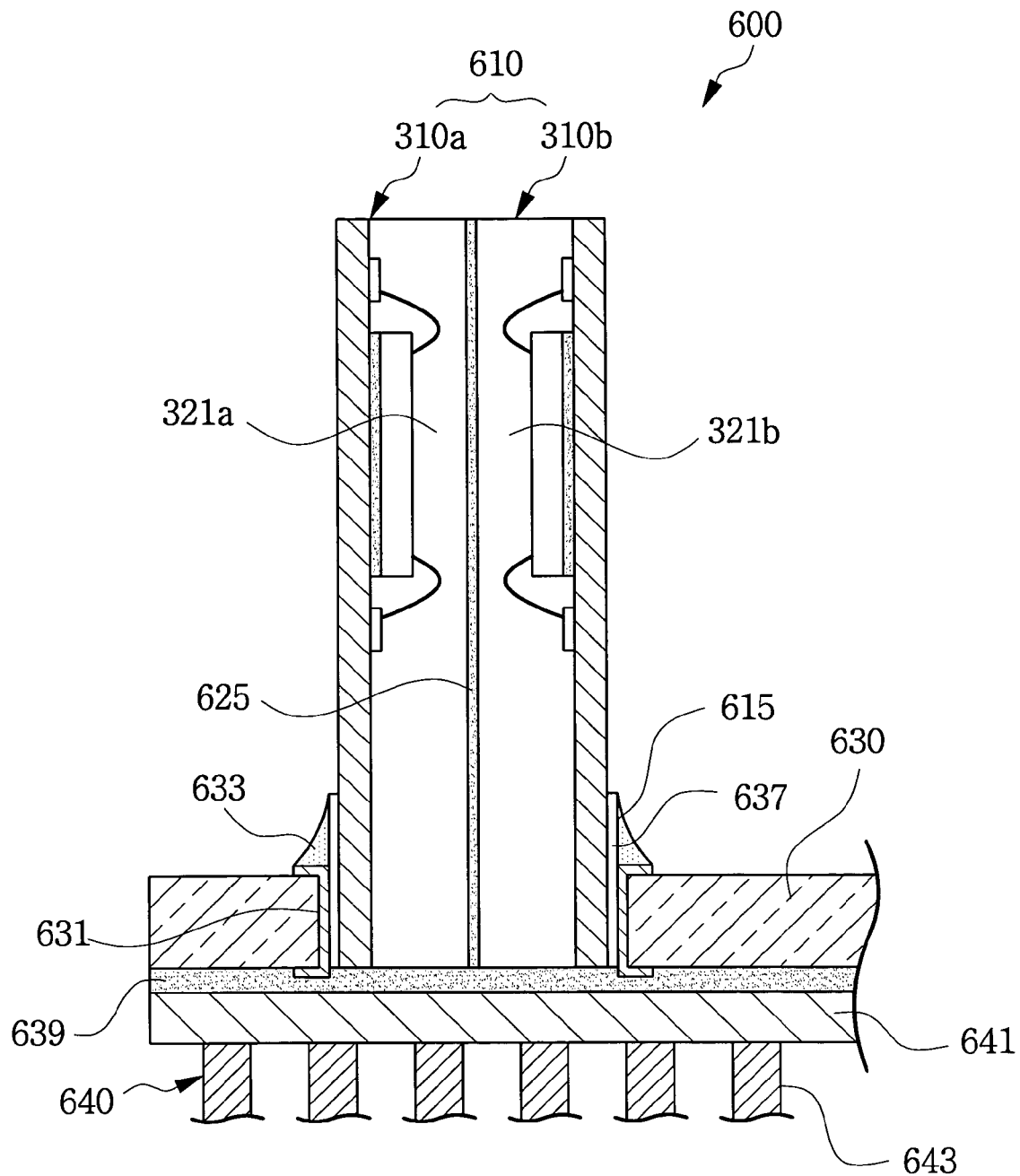
FIG. 12 is a cross-sectional view partially showing a semiconductor module in accordance with another exemplary embodiment of the present invention.

FIG. 12 partially shows, in a cross-sectional view, a semiconductor module in accordance with another exemplary embodiment of the present invention. Referring to FIG. 12, a module 600 may include a plurality of semiconductor chip packages 610 that may be mounted by insertion in a vertical direction to a module board 630. With the exception of the size of a given insertion hole 631, the module board 630 may be the same as described in FIGS. 3–6. In addition, a heat sink 640, having a base plate 641 and several protrusions 643, may be the same as described in FIGS. 3–11.

A given package 610 in FIG. 12 may be embodied as a package stack type of package. Two individual packages 310a and 310b stacked laterally may be understood as a package stack type of package, for example. A given individual package 310a and 310b has the same structure as discussed in FIG. 9, but this structure is exemplary only. Other package structures discussed in any of the exemplary embodiments may also be used for the individual packages 310a and 310b of the package stack 610 embodiment, for example.

Encapsulants 321a and 321b of the individual packages 310a and 310b may face each other and may be joined by an adhesive 625. The insertion hole 631 of the module board 630 size configured to receive the package stack 610. A given package stack 610 may be inserted at one end into the corresponding insertion hole 631, and substrate connection paths 615 on the package stack 610 may be in substantially close relation to the board connection paths 633 so as to touch and/or contact the board connection paths 633 in the insertion hole 631. The package stacks 610 may thus be mechanically mounted and electrically coupled to the module board 630. A solder 637 may be used between the substrate connection paths 615 and the board connection paths 633.

Figure 13:
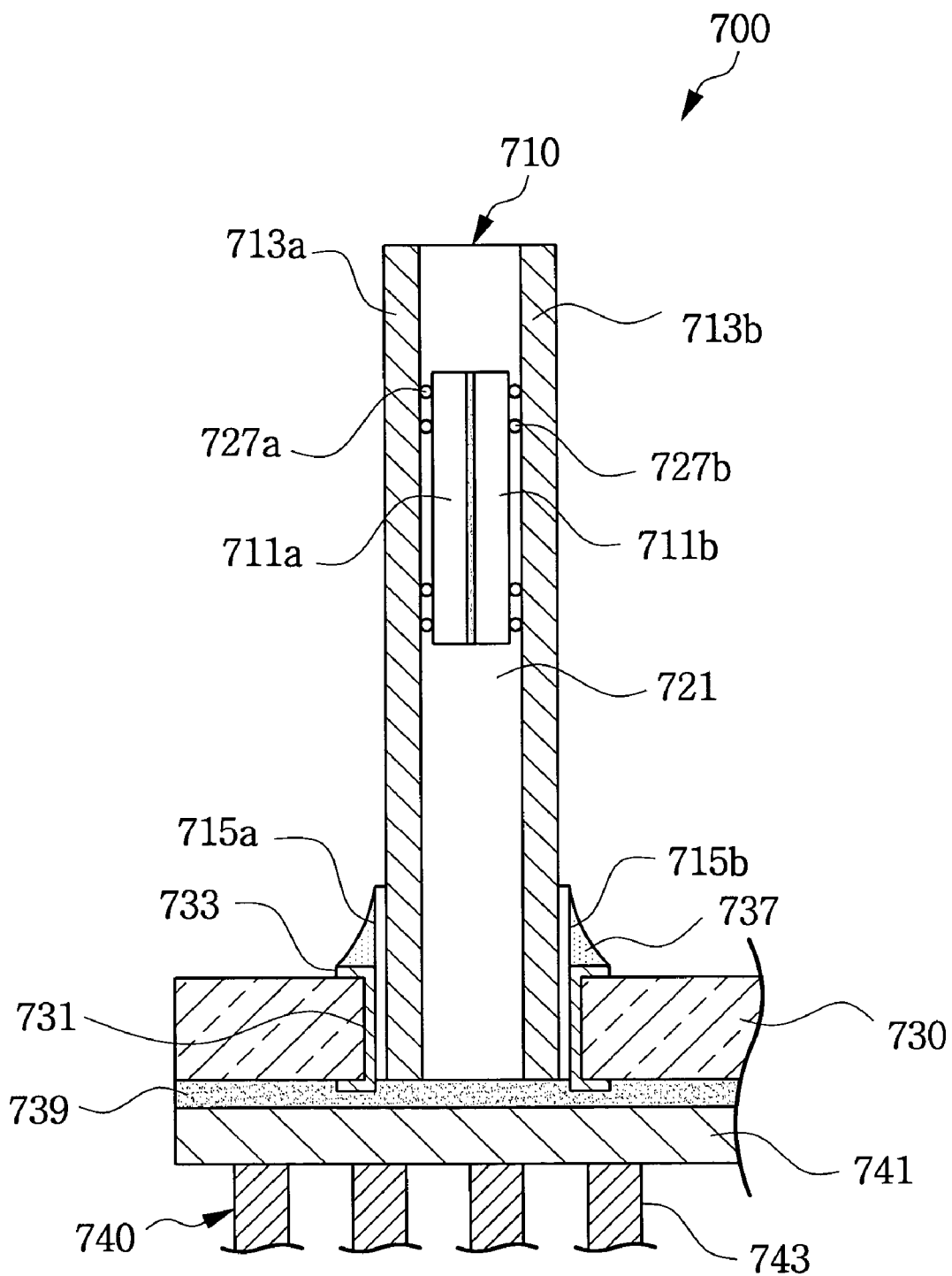
FIG. 13 is a cross-sectional view partially showing a semiconductor module in accordance with another exemplary embodiment of the present invention.

FIG. 13 partially shows, in a cross-sectional view, a semiconductor module in accordance with another exemplary embodiment of the present invention. Referring to FIG. 13, a module 700 may include a plurality of semiconductor chip packages 710 that may be mounted by insertion in a vertical direction to a module board 730. The module board 730 insertion holes 731 and board connection paths 733 may be substantially the same as described in FIG. 12. In addition, a heat sink 740 composed of a base plate 741 and several protrusions 743 may be the same as described in FIGS. 3–12.

A given package 710 in FIG. 13 may be embodied as a chip stack type. Two semiconductor chips 711a and 711b that may be attached respectively to circuit substrates 713a and 713b through bumps 727a and 727b by using flip-chip bonding technique may be understood as a chip stack type of package, for example. The bumps 727a and 727b may be formed on chip pads (not shown) of an active surface of a given chip 711a and 771b may be joined to substrate pads (not shown) of a given substrate 713a and 713b. Back surfaces of the chips 711a and 711b may be joined by an adhesive 725. The exemplary chip stack structure is exemplary only, and other suitable chip stacks may be used as is evident to those of ordinary skill in the art. An encapsulant 721 may be provided in a space between both substrates 713a and 713b to surround the chips 711a and 711b. Substrate connection paths 715a and 715b may be formed on outer faces of substrates 713a and 713b, and may be electrically coupled to the substrate pads.

A given chip stack package 710 may be inserted at one end into a corresponding insertion hole 731, and the substrate connection paths 715 may be in substantially close relation to the board connection paths 733 so as to touch the board connection paths 733. The chip stack packages 710 may thus be mechanically mounted and electrically coupled to the module board 730. A solder 737 may be used between the substrate connection paths 715 and the board connection paths 733, as discussed above.

Figure 14:
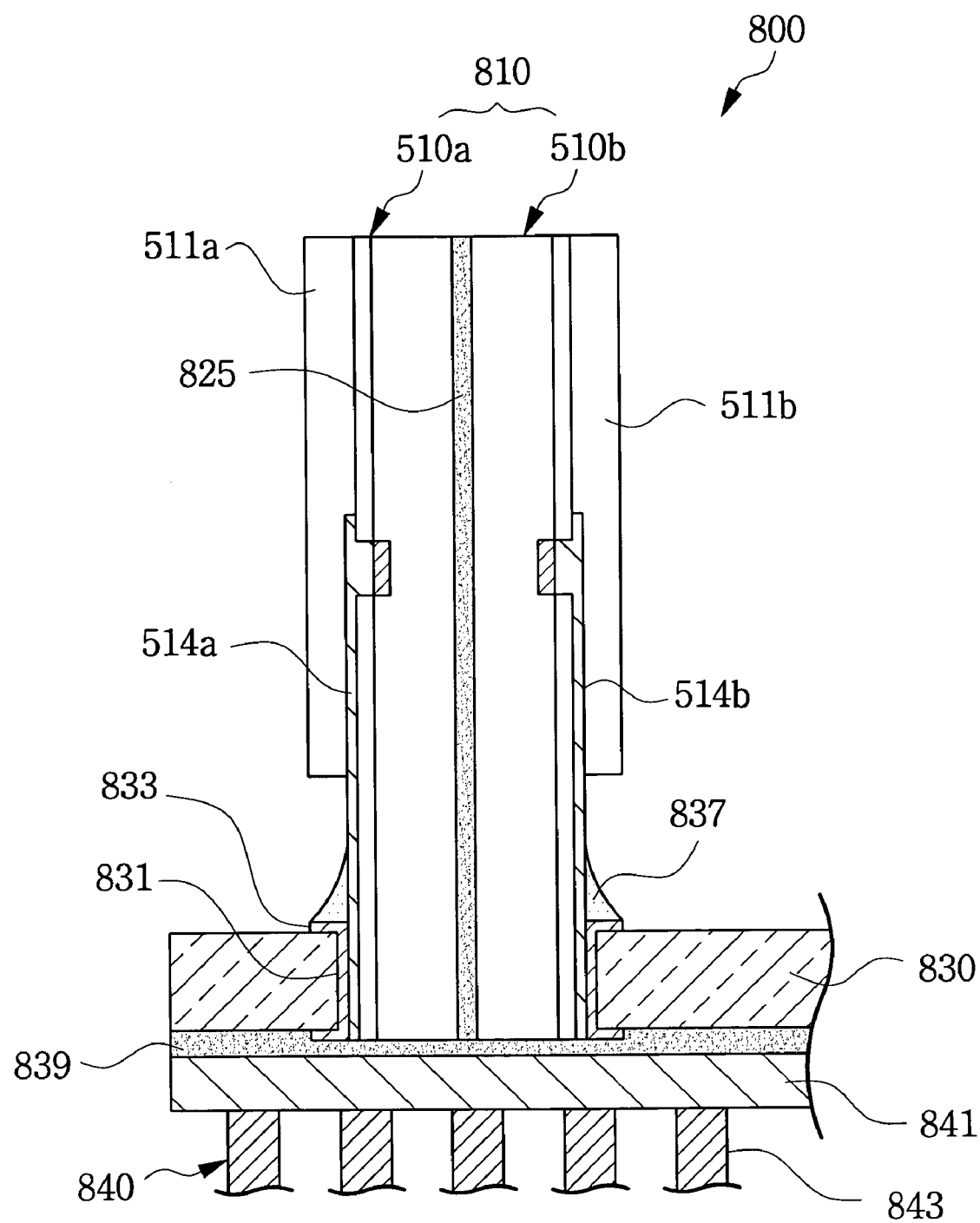
FIG. 14 is a cross-sectional view partially showing a semiconductor module in accordance with another exemplary embodiment of the present invention.

FIG. 14 partially shows, in a cross-sectional view, a semiconductor module in accordance with another exemplary embodiment of the present invention. Referring to FIG. 14, a module 800 may include a plurality of semiconductor chip packages 810 that may be mounted by insertion in a vertical direction to a module board 830. The module board 830 with insertion holes 831 and board connection paths 833 may be the same as described in FIG. 13. In addition, a heat sink 840 composed of a base plate 841 and several protrusions 843 may be the same as described in FIGS. 3–13.

A given package 810 may be embodied as a chip stack type, for example, but no circuit substrate is employed. A given chip stack package 810 may include two semiconductor chips 510a and 510b. Chips 510a and 510b may be rerouted chip, as described in FIG. 11. The chips 510a and 510b may be stacked back-to-back and joined by an adhesive 825.

A given chip stack package 810 may be inserted at one end into the corresponding insertion hole 831, and the rerouting paths 514a and 514b of the chips 510a and 510b may be in substantially close relation so as to touch corresponding board connection paths 833. The chip stack packages 810 may thus be mechanically mounted and electrically coupled to the module board 830. A solder 837 may be used to enhance corrective integrity between the rerouting paths 514a and 514b and the board connection paths 833, for example.

Figure 15:
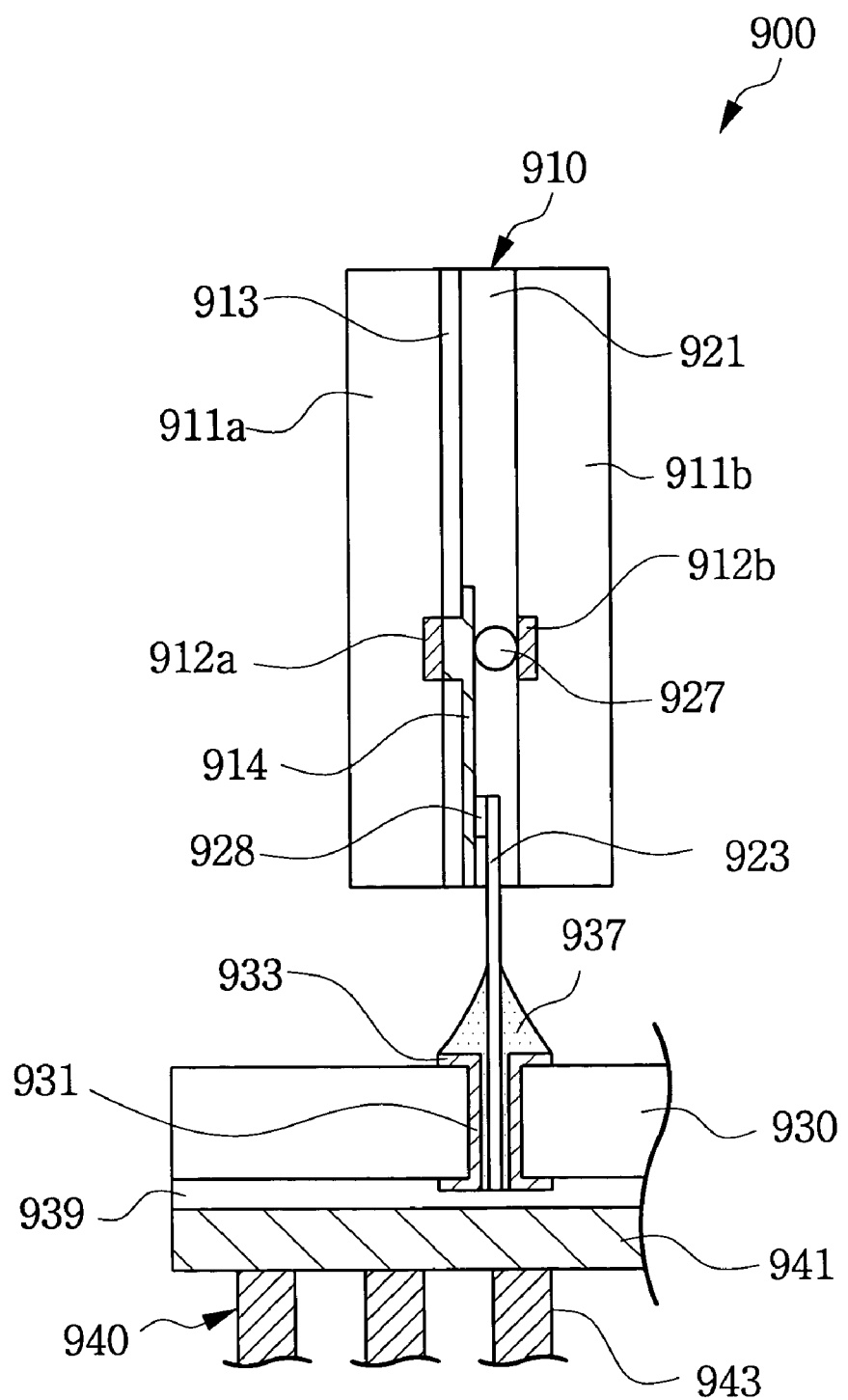
FIG. 15 is a cross-sectional view partially showing a semiconductor module in accordance with another exemplary embodiment of the present invention.

FIG. 15 partially shows, in a cross-sectional view, a semiconductor module in accordance with another exemplary embodiment of the present invention. Referring to FIG. 15, a module 900 may include a plurality of semiconductor chip packages 910 that may be mounted by insertion in a vertical direction to a module board 930. The module board 930 is similar as described in FIGS. 7 and 8. That is, the module board 930 has groups of insertion holes 931, a given group corresponding to a given package 910. A heat sink 940, having a base plate 941 and several protrusions 943, may be the same as described in FIGS. 3–14.

A given package 910 may also be a chip stack type a package, as in FIGS. 13 and 14. A given chip stack package 910 may have two semiconductor chips 911a and 911b that may be stacked in a face-to-face relationship. One chip 911a may the rerouted chip as described in FIG. 11, and the other chip 911b may be a normally configured chip. That is, the rerouted chip 911a may have chip pads 912a on an active surface thereof, and the chip pads 912a may be electrically coupled to rerouting paths 914. The normal chip 911b may also have chip pads 912b on an active surface thereof, for example.

The active surfaces of both chips 911a and 911b may face each other, and the chip pads 912b of the normal chip 911b may be electrically coupled to the rerouting paths 914 of the rerouted chip 911a by bumps 927. An encapsulant 921 may fill a space between the chips 911a and 911b to protect the active surfaces, the rerouting paths 914 and the bumps 927. Further, connection leads 923 may be provided between the chips 911a and 911b. One end of connection lead 923 may be embedded in the encapsulant 921 and connected to the rerouting path 914 through a solder 928. The other end of connection lead 923 may protrude out from the encapsulant 921, as shown in FIG. 15.

The protruding ends of the respective connection leads 923 may be inserted into the corresponding insertion holes 931 of the module board 930, and may be in substantially close relation so as to touch respective board connection paths 933 in the insertion holes 931. So, the chip stack packages 910 are mechanically mounted and electrically coupled to the module board 930. A solder 937 may be used between the connection leads 923 and the board connection paths 933.

Figure 16:
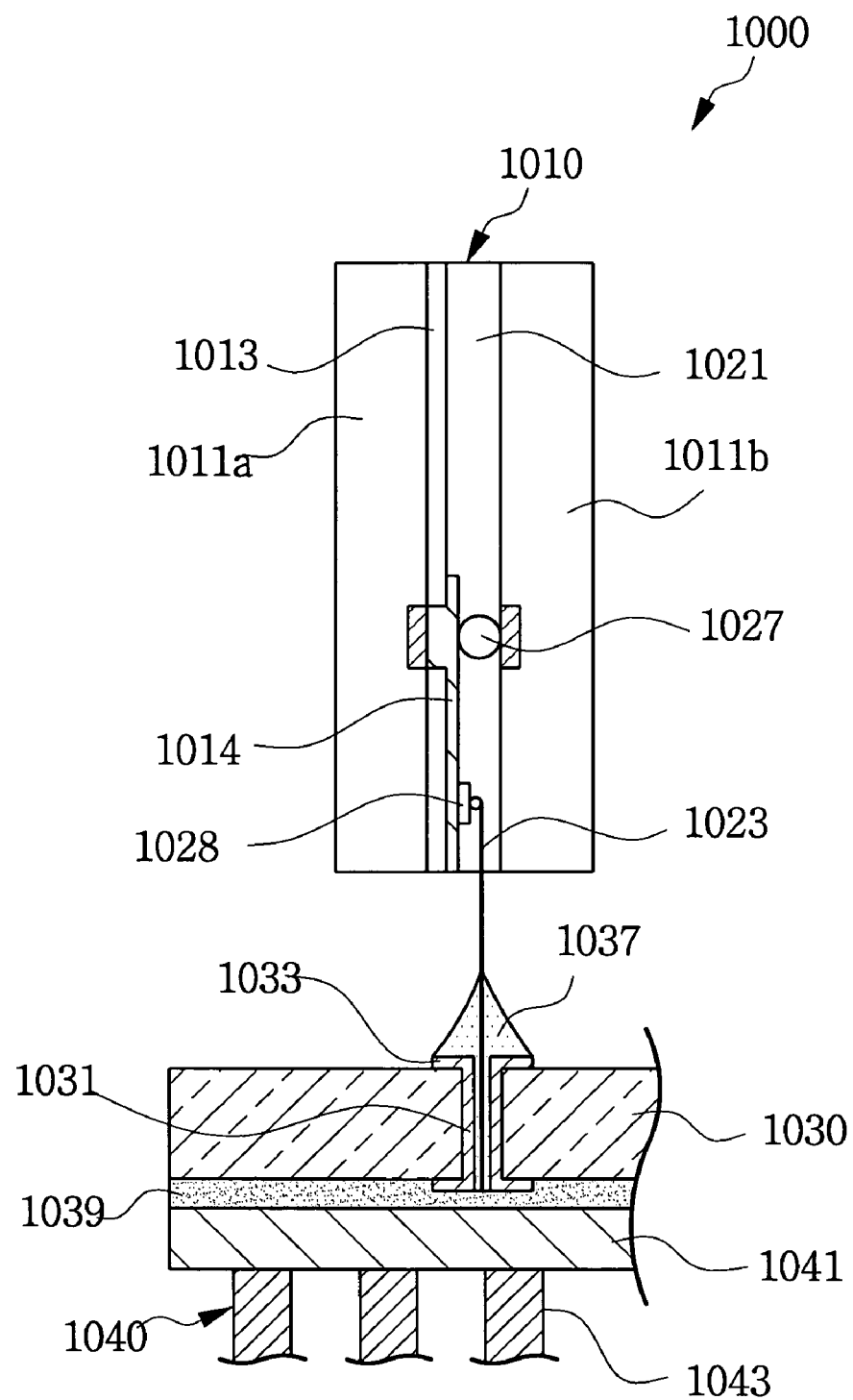
FIG. 16 is a cross-sectional view partially showing a semiconductor module in accordance with another exemplary embodiment of the present invention.
Figure 17:
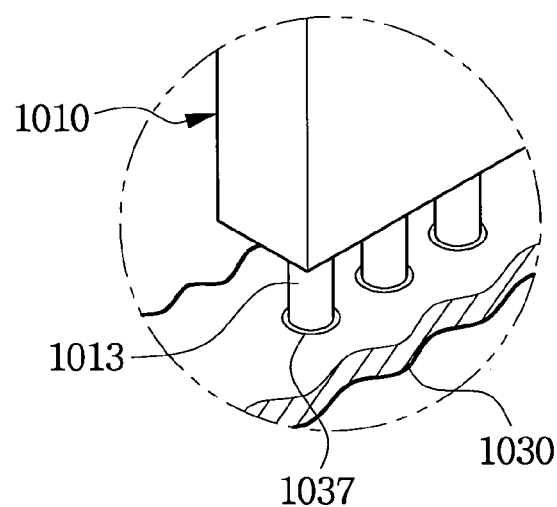
FIG. 17 is a perspective view partially illustrating the semiconductor module shown in FIG. 16.

FIG. 16 partially shows, in a cross-sectional view, a semiconductor module in accordance with another exemplary embodiment of the present invention. FIG. 17 partially shows, in a perspective view, the module of FIG. 16. Referring to FIGS. 16 and 17, a module 1000 according to this embodiment may have a plurality of semiconductor chip packages 1010 that may be mounted by insertion in a vertical direction to a module board 1030. Except for the size of insertion holes 1031, the module board 1030 is the same as described in FIG. 15. In addition, a heat sink 1040, having a base plate 1041 and several protrusions 1043, may be the same as described in FIGS. 3–15.

A given package 1010 in FIG. 16 is substantially the same as described in FIG. 15, except the connection leads. Instead of the connection leads, the chip stack package 1010 employs connection wires 1023 made of gold, for example. The connection wires 1023 may be reinforced with nickel plating. One end of connection wire 1023 may be embedded in an encapsulant 1021 and connected to a rerouting path 1014 through a bump 1028. The other end of the given connection wire 1023 may protrude out from the encapsulant 1021.

The protruding ends of the respective connection wires 1023 may be inserted into the corresponding insertion holes 1031 of the module board 1030, and may be in substantially close relation to board connection paths 1033 so as to touch respective board connection paths 1033 in the insertion holes 1031. The chip stack packages 1010 may thus be mechanically mounted and electrically coupled to the module board 1030. A solder 1037 may be used between the connection wires 1023 and the board connection paths 1033, similar to as previously discussed.

Figure 18:
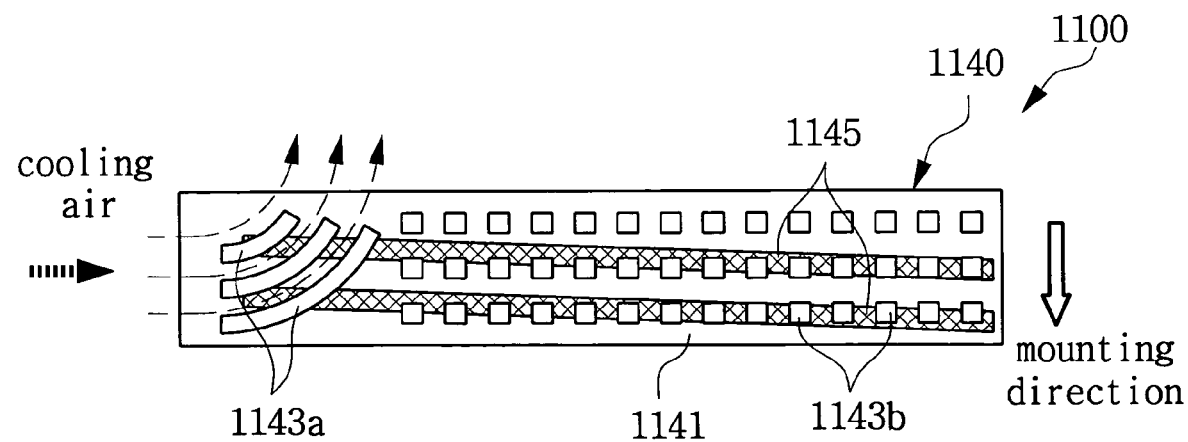
FIG. 18 is a plan view showing a bottom of a semiconductor module in accordance with another exemplary embodiment of the present invention.
Figure 19:
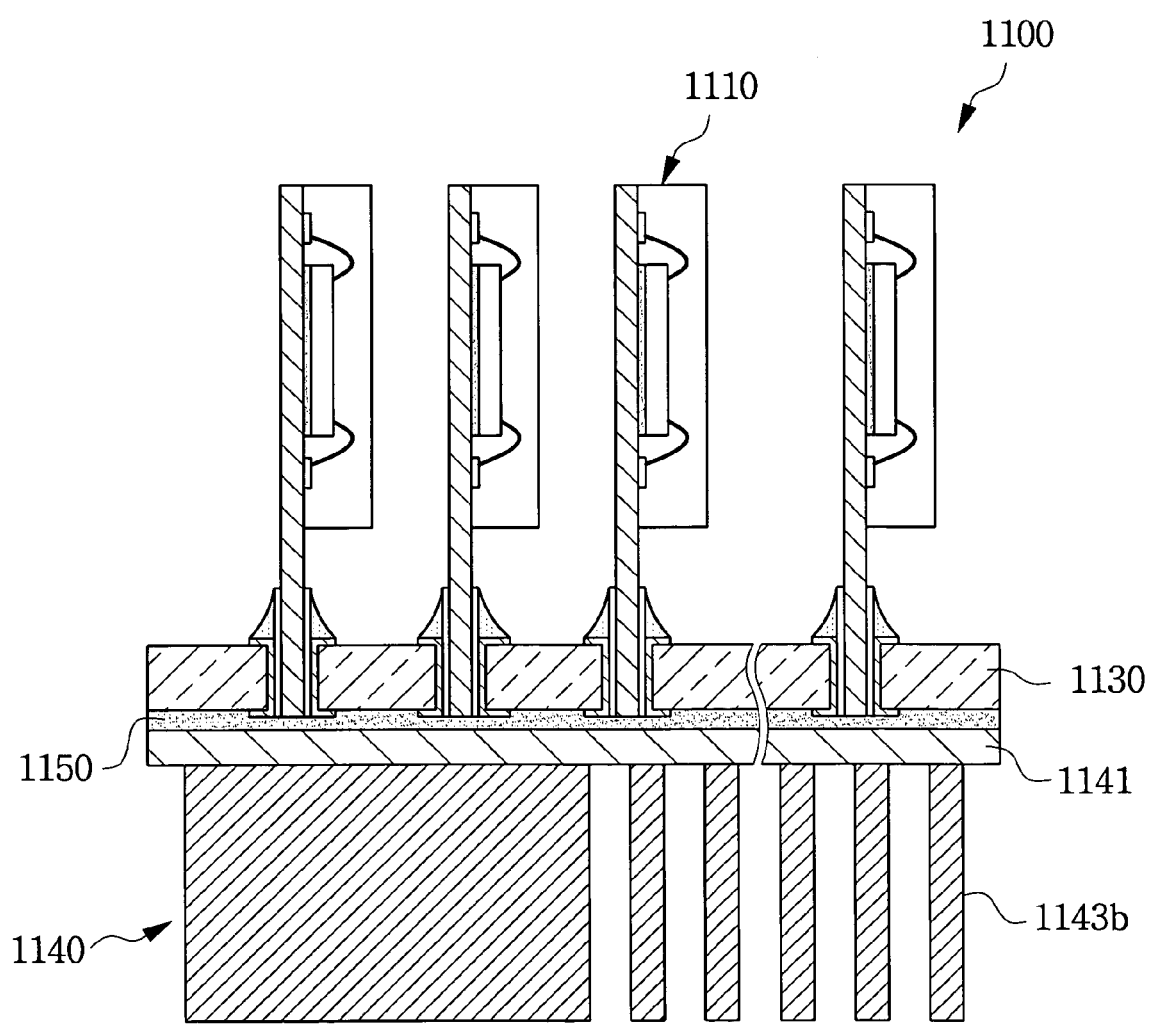
FIG. 19 is a cross-sectional view of a semiconductor module of FIG. 18.

FIG. 18 shows, in a plan view, a bottom of a semiconductor module in accordance with another exemplary embodiment of the present invention. FIG. 19 shows, in a cross-section view, the module shown in FIG. 18. Referring to FIGS. 18 and 19, a module 1100 includes an alternative heat sink 1140. Except for the heat sink 1140, packages 1110 and module board 1130 may be the same as described in FIGS. 3–6 Those skilled in this art will appreciate that other types of packages and module boards discussed in FIGS. 3–17 may also be used together with the heat sink 1140.

The heat sink 1140 may be attached to the bottom face of the module board 1130 by an adhesive 1150 having relatively good thermal conductivity. The heat sink 1140 may be composed of a base plate 1141 adjoining the module board 1130 and two types of protrusions 1143a and 1143b, extending downward.

Generally, the module 1110 may be mounted on a next-level board of an external system through external contact terminals (element 134 shown in FIG. 3) in a mounting direction, as shown in FIG. 18. Further, a cooling air produced by a cooling fan in the system may be supplied in general to one side of the module 1110, so as to remove heat away from the module 1100 to the external atmosphere. A first type of the protrusions 1143a may be curved from a blowing direction of the cooling air toward the opposite direction (i.e., to the mounting direction), as shown in FIG. 18. The curved protrusions 1143a may guide the flow of the cooling air to the external atmosphere, away from module 1100, so heat generated from the module 1100 is easily removed toward the external atmosphere or air. Those skilled in this art will appreciate that the curved protrusions 1143a may have alternative shapes and configurations.

In addition, the heat sink 1140 may further include heat pipes 1145 that are provided on base plate 1141. The heat pipes 1145 may slope down across the base plate toward the center of gravity of the module (i.e., along the mounting direction, namely, toward the center of gravity). Heat generated at the side opposite to the curved protrusions 1143a may be removed toward the external atmosphere away from module 1110 along the heat pipes 1145.

The exemplary embodiments of the present invention being thus described, it will be obvious that the same may be varied in many ways. Such variations are not to be regarded as departure from the spirit and scope of the exemplary embodiments of the present invention, and all such modifications as would be obvious to one skilled in the art are intended to be included within the scope of the following claims.

What is claimed is:

1. A semiconductor module, comprising:
   a module board including a plurality of insertion holes;
   a plurality of semiconductor packages inserted at first ends thereof in a vertical direction into corresponding insertion holes; and
   a heat sink composed of a base plate and a plurality of protrusions which extend downward from the base plate.

2. The module of claim 1, the module board further including:
   a first face,
   a second face, and
   a plurality of board connection paths provided in the insertion holes, wherein the insertion holes are in spaced relation with one another and in contact with the first face and second face.

3. The module of claim 2, wherein the packages are inserted in the insertion holes so that the packages are mechanically mounted on the first face of the module board and electrically coupled to the board connection paths.

4. The module of claim 2, wherein
   the base plate is attached to the second face, and
   the protrusions extend in a direction that is opposite a direction in which the vertically arranged packages extend from the insertion holes of the module board.

5. The module of claim 1, wherein at least one of the packages includes at least one semiconductor chip.

6. The module of claim 5, wherein at least one of the packages includes a circuit substrate on which the chip is attached.

7. The module of claim 6, wherein the circuit substrate includes a plurality of substrate connection paths electrically coupled to the chip and in substantially close relation to the board connection paths so as to contact the board connection paths.

8. The module of claim 6, wherein the circuit substrate includes a heat slug arranged thereon so as to be and positioned underneath the chip.

9. The module of claim 5, wherein at least one of the packages includes a lead frame on which the chip is attached.

10. The module of claim 9, wherein the lead frame includes a plurality of lead pairs electrically coupled to the chip and in substantially close relation to the board connection paths so as to contact the board connection paths.

11. The module of claim 5, wherein the chip is embodied as a rerouted chip with a plurality of rerouting paths that thereon and in substantially close relation to the board connection paths so as to contact the board connection paths.

12. The module of claim 1, wherein at least one of the packages is embodied as a package stack in which at least two individual packages are stacked laterally.

13. The module of claim 12, wherein at least one of the individual packages of the package stack includes at least one semiconductor chip.

14. The module of claim 13, wherein at least one of the individual packages includes a circuit substrate on which the chip is attached.

15. The module of claim 14, wherein the circuit substrate includes a plurality of substrate connection paths electrically coupled to the chip and in substantially close relation to the board connection paths so as to contact the board connection paths.

16. The module of claim 1, wherein at least one of the packages is embodied as a chip stack in which at least two semiconductor chips are stacked laterally.

17. The module of claim 16, wherein the chip stack includes two circuit substrates, each circuit substrate having a corresponding chip attached thereon.

18. The module of claim 17, wherein at least one of the circuit substrates includes a plurality of substrate connection paths electrically coupled to the chip and in substantially close relation to the board connection paths so as to contact the board connection paths.

19. The module of claim 16, wherein each of the chips is embodied as a rerouted chip including a plurality of rerouting paths thereon and in substantially close relation to the board connection paths so as to contact the board connection paths.

20. The module of claim 16, wherein
   a first chip of the chip stack is embodied as a rerouted chip that has a plurality of rerouting paths provided thereon, and
   a second chip of the chip stack is chip including a plurality of bumps thereon and electrically coupled to the rerouting paths of the first chip.

21. The module of claim 20, wherein
   the chip stack includes a plurality of connection leads arranged between the first and second chips and connected to the rerouting paths of the first chip, and
   the connection leads are in substantially close relation to the board connection paths so as to contact the board connection paths.

22. The module of claim 20, wherein
   the chip stack includes a plurality of connection wires arranged between the first and second chips and connected to the rerouting paths of the first chip, and
   the connection wires are in substantially close relation to the board connection paths so as to contact the board connection paths.

23. The module of claim 1, further comprising:
   a plurality of board connection paths provided in the insertion holes; and
   a solder provided between a given package and the board connection paths.

24. The module of claim 1, wherein the base plate includes a plurality of grooves configured to receive the first ends of the packages protruding downward from the insertion holes.

25. The module of claim 1, wherein the heat sink includes curved protrusions extended downward from the base plate and oriented so as to guide the flow of a cooling air across the module from to the external atmosphere.

26. The module of claim 1, wherein the heat sink includes a plurality of heat pipes on the base plate and sloping down across the base plate toward the center of gravity of the module.

27. The module of claim 1, wherein the heat sink is attached to the module board by an adhesive.

28. The module of claim 1, wherein the module is a memory module.

29. A method of fabricating a semiconductor module, comprising:
- forming a module board;
- forming a plurality of insertion holes in the module board;
- inserting a plurality of semiconductor packages at first ends thereof in a vertical direction into corresponding insertion holes; and
- attaching a heat sink composed of a base plate and a plurality of protrusions which extend downward from the base plate to the module board.

30. The method of claim 29, wherein the formed module board includes a first face and a second face, the method further comprising:
- forming a plurality of board connection paths in the insertion holes, wherein the insertion holes are formed so as to be in spaced relation with one another and in contact with the first face and second face.

31. The method of claim 30, wherein inserting the packages further includes inserting the packages in the insertion holes so that the packages are mechanically mounted on the first face of the module board and electrically coupled to the board connection paths.

32. The method of claim 30, wherein attaching the heat sink further includes:
- affixing the base plate to the second face, and
- affixing the protrusions to the base plate so that the protrusions extend in a direction that is opposite a direction in which the vertically arranged packages extend from the insertion holes of the module board.

33. A semiconductor module formed by the method of claim 29.

* * * * *